United States Patent [19]

Takimoto et al.

[11] Patent Number: 5,331,182
[45] Date of Patent: Jul. 19, 1994

[54] ORGANIC LIGHT EMITTING DEVICE AND PREPARATION AND USE THEREOF

[75] Inventors: Akio Takimoto; Michio Okajima; Masaaki Suzuki; Hisahito Ogawa, Ikoma, all of Japan

[73] Assignee: Matsushita Electric Industrial Co., Ltd., Osaka, Japan

[21] Appl. No.: 742,421

[22] Filed: Aug. 8, 1991

[30] Foreign Application Priority Data

Aug. 8, 1990 [JP] Japan .................. 2-211056
Nov. 29, 1990 [JP] Japan .................. 2-335909

[51] Int. Cl.5 ............................. H01L 29/28
[52] U.S. Cl. ............................ 257/40; 257/103; 313/504
[58] Field of Search ............ 257/40, 103; 313/504, 313/506

[56] References Cited

FOREIGN PATENT DOCUMENTS 0218422 4/1987 European Pat. Off. .

OTHER PUBLICATIONS

Tang et al., "Applied Physics Letters", 51(12) 913–915 (Sep. 1987).
Kapustin et al., "Chemical Abstracts", 110(6) 39651c (1989).
Vannikov et al., "Journal of Molecular Electronics", 5(1) 63–70 (Mar. 1989).
Kanemitsu et al., "Applied Physics Letters", 54(10) 872–874 (Mar. 1989).
Blinov, L. M., "Sovient Physics USPEKHI", 31(7) 623–644 (Jul. 1988).

Primary Examiner—Sara W. Crane
Attorney, Agent, or Firm—Wenderoth, Lind & Ponack

[57] ABSTRACT

An organic light-emitting device having a light-emitting layer contains the polymer comprising a repeating unit of the formula:

$$-Z-(X-Y)_n- \quad (I)$$

wherein n is at least 2; X is O, S, Se or Te; Y is an aromatic or substituted aromatic group; Z is a group containing an imide circle and also having the carrier transport layer and/or the light receiving layer contain the polymer comprising a repeating unit of the following formula:

$$-(X-Y)_n- \quad (II)$$

wherein n is at least 2; X is O, S, Se or Te; Y is an aromatic or substituted aromatic group, which is used for a display or a light spatial modulator or an optical neural network system.

7 Claims, 13 Drawing Sheets

1···BPDA-Ph5
2···BPDA-Ph3
3···BPDA-Ph4
4···BPDA-Ph2

ORGANIC LIGHT EMITTING DEVICE AND PREPARATION AND USE THEREOF

BACKGROUND OF THE INVENTION

1. Field of the Invention

The present invention relates to an organic light-emitting device such as a spatial light modulator, a light neural network device and etc. used for an optical computing device and a light emitting type display, a method for preparing the same.

2. Description of the Related Art

The light-emitting device generally includes 1) a light emitting display device constituting a light-emitting layer between a lower electrode on a base plate and a upper electrode, 2) an electric field light emitting device constituting a light emitting layer laminated on a carrier transport layer supported by a base plate and 3) a spatial light modulator type device constituting a lower electrode on a base plate and a light-emitting layer, a carrier transport layer and a transparent electrode which are laminated in turn on the lower electrode.

Recently, it is reported that a preparation trial of an organic light emitting device was made by using an organic compound as a necessary constituent. For example, the L256 page of Japanese Journal of Applied phisics 27(2)(1988 discloses an electric field light emitting device having a laminated structure provided with an organic light emitting layer and a carrier transport layer as the above type 2). In the device, a semi-transparent lower electrode of Au is mounted on a glass base plate and thereon are mounted in turn many layers, which are a hole transort layer of N,N'-diphenyl-N,N'-(3-methylphenyl)-1,1'-biphenyl-4,4'-diamine (hereinafter referred to as TPD) having a 2000 Å coating, an organic light emitting layer and an electron transport layer of perylene-tetracarboxyl group derivatives, the latter two layers being 1000 Å coating in thickness.

Further, the upper electrode comprises Mg coating. A bright light emission was observed by applying an electrostatic field to the lower and upper electrodes when phthaloperynone derivatives is used as a material of the organic light emitting layer (see the priprint for the 35th Spring Lecture Meeting of the Applied Physics Society). The emitting light can be varied depending on a material of the organic light emitting layer to be selected.

Further, as to the above type 3) it is reported that another organic light emitting device constituted by using an amorphous alloy of $Si_{1-x}C_x:H$ as a light emitting type spatial light modulator used for an optical computing device and so on (see the priprint for the 37th Spring Lecture Meeting of the Applied Physics Society).

In the reported device, lamination of a carrier transport layer and a light emitting layer make the number of electron inplating increased and thus make luminous efficiency thereof improved in comparison of the convenient organic light emitting device, but the efficiency is below 0.5% and more development is needed. Further, change with time of luminous brightness is large and especially there comes to arise problems such as lowering of electron inplating efficiency for the light emitting layer and accumulation of spatial carrier in the carrier transport layer.

The lowering of luminous brightness is caused by the following factors:

1) quenching caused by crystallization of the molecule constituting light emitting layer.

2) decomposition of the molecule constituting a light emitting layer caused by the reaction thereof with oxygen molecule and so on.

3) obstruction of electron inplating from outside caused by the accumulation of carrier in the light emitting layer.

SUMMARY OF THE INVENTION

To solve the aforementioned problems of the prior arts, the first object of the present invention is to provide an organic light emitting device having an ability of high brightness and small change with time of the luminous brightness.

The second object of the present invention is to provide an organic light emitting device having at least a carrier transport layer and a light emitting layer between an upper electrode and a lower electrode mounted on a base plate.

The third object of the present invention is to provide an organic light emitting device having a carrier transport layer, a light receiving layer and a light emitting layer used for a light neural network device.

The fourth object of the present invention is to provide a process for preparing the organic light emitting device.

To achieve the above objects, according to a first aspect of the present invention, there is provided an organic light emitting device which comprises a light emitting layer containing a polymer comprising a repeating unit of the formula:

$$-Z-(X-Y)_n- \quad (I)$$

wherein n is at least 2, X is O, S, Se or Te, Y is an aromatic or substituted aromatic group, Z is a group containing an imide ring.

In the above construction, it is preferred that the polymer represented by the formula (I) is laminated with another light receiving layer.

According to a second aspect of the present invention, there is provided an organic light emitting device which comprises at least a light emitting layer and a carrier transport layer, wherein the light emitting layer containing a polymer comprising a repeating unit of the formula:

$$-Z-(X-Y)_n- \quad (I)$$

wherein n is at least 2, X is O, S, Se or Te, Y is an aromatic or substituted aromatic group, Z is a group containing an imide ring. In this case, it is preferred that the carrier transport layer is constituted of a polymer represented by the following formula:

$$-(X-Y)_n- \quad (II)$$

wherein n is at least 2, X is O, S, Se or Te, Y is an aromatic or substituted aromatic group.

According to a third aspect of the present invention, there is provided an organic light emitting device used for an optical neural network device which comprises at least a light emitting layer, a carrier transport layer and a light receiving layer, wherein the light emitting layer containing a polymer comprising a repeating unit of the formula:

$$-Z-(X-Y)_n- \quad (I)$$

wherein n is at least 2, X is O, S, Se or Te, Y is an aromatic or substituted aromatic group, Z is a group containing an imide circle. In this case, it is preferred that the carrier transport layer and/or the light receiving layer are constituted of a polymer comprising a repeating unit represented by the following formula:

$$-(X-Y)_n- \quad (II)$$

wherein n is at least 2, X is O, S, Se or Te, Y is an aromatic or substituted aromatic group.

In the device, it is preferred that a wavelength of the light emitting from the light emitting layer is shorter than that of an absorbed light by the light receiving layer.

According to a fourth aspect of the present invention, there is provided a method for preparing the organic light emitting device wherein a polymer represented by the formula (I) is laminated on a surface of the base plate as a light emitting layer by using a method of gas-liquid boundary developing growth.

In the present invention, there are provided the following functions and effects:

1. As a light emitting layer is made of a polymer layer containing a repeating unit of the formula (I), the light emitting layer is incorporated into a backbone of main chain or a side chain of a heat resistive polymer and the Z group functioned as a light emitting part is dispersed by the molecular level in a matrix not to be coagulated with each other. Thereby, there is provided an organic light emitting device having an ability of high brightness and small change with time of luminous brightness. Further, the Y group of the formula (I) has a superior ability of carrier transport in the layer, thus little carrier accumulation is observed in the layer.

2. According to the preferred embodiment wherein a light emitting layer comprises a polymer of the formula (I) and is laminated with another light receiving layer, there is provided a more improvement of luminescent efficiency.

3. According to the process for preparing an organic light emitting device wherein a polymer containing a repeating unit of the formula (I) is laminated on the base plate by a gas-liquid boundary developing growth method, there is provided a thin and no defective coating. A light emitting portion of the light emitting layer is limited in a neighborhood of the boundary between the light emitting layer and another carrier transport layer or the electrode. Therefore, it is advantageous to form a light emitting layer thin to a degree of having no pin-hole. Further, it is advantageous that the thin layer can lower a driving voltage. Especially, it is preferable that the polymer represented by the formula (I) is laminated on the base plate by a LB method (Langmuir-Blodgett's technique), in that there can be provided a polymer layer having a few atomic layer thickness and no pin-hole.

4. According to the light emitting device used for an optical neural network device comprising a lower electrode on a base plate and thereon laminating a light receiving layer, a light emitting layer containing a polymer of the repeating unit of the formula (I), a carrier transport layer and a transparent electrode in turn, the device comes to have an exact recognizing ability.

5. A polymer containing a repeating unit of the formula (II) has a high carrier transport ability and a high optical sensitivity. It is found by us that an increasing crystallinity of the polymer leads to a remarkable increasing sensitivity. In the organic light emitting device, the amorphous of the carrier transport layer is the largest cause for lowering of the carrier transport efficiency into the light emitting layer and accumulation of the space charge in the carrier transport layer. The reason that the carrier transport layer is an amorphous is to realize to form a layer having a thin thickness and no pin hole in order to provide a device having a light emitting ability by means of a low voltage. However, that necessarily make a carrier trap density increased and thus a carrier mobility does not become large. On the other hand, it is advantageous that the polymer comprising a repeating unit of the formula (II) is a crystalline and provide a layer having no pin hole.

6. In the case that a wavelength of the emitting light from the organic light emitting device is shorter than that of the absorbing light, the device provides a memory ability. That is caused by that the polymer layer contributes to the absorbing light as a carrier emitting layer.

7. The polymer comprising a repeating unit of the formula (II) is effective to use of a light receiving layer of a spatial light modulator. The electron inplating efficiency between an inorganic light sensitive layer represented by an amorphous alloy of the formula $Si_{i-x}C_x$ and an organic light emitting layer is depended on a work function difference. On the other hand, the electron inplating efficiency between the polymer layer and an organic light emitting layer is as high as the boundary bonding condition therebetween.

DETAILED DESCRIPTION OF THE INVENTION

Figure 1:
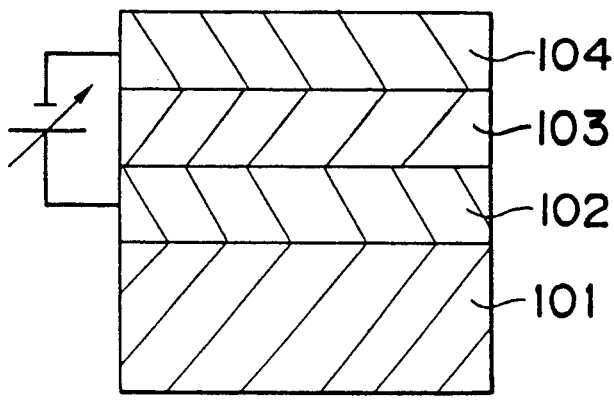
FIG. 1, 2 and 3 are cross sections of three examples of the light emitting device according to the present invention.

Referring now to the drawings, embodiments of the present invention will be explained in detail.

FIG. 1 is a sectional view of an first embodiment of the organic light emitting device used for an electric display device. In the device, on a transparent insulating base plate (for example, made of glass) 101 there is mounted a transparent electroconductive electrode 102 (for example, made of ITO or $SnO_x$) and an organic light emitting layer 103 is laminated thereon. On the light emitting layer 103, an upper electrode 104 is mounted. Between the electroconductive electrode 102 and the upper electrode 104, there is applied a DC or AC electric field as an outer voltage. The organic light emitting layer 103 is preferably 5 to 5000 Å in thickness.

Figure 2:
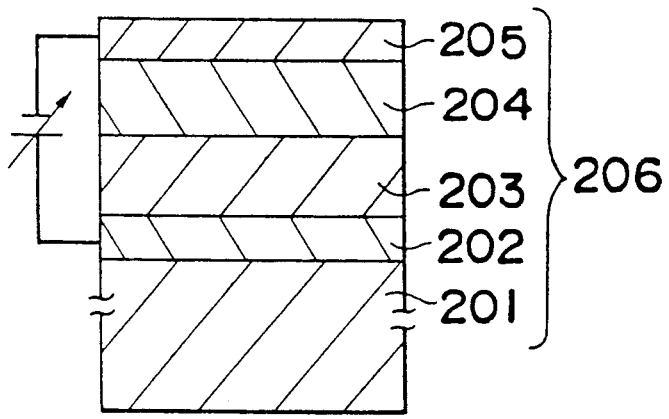

FIG. 2 is a sectional view of an second embodiment of the organic light emitting device used for an electric display device. In the device, on a transparent insulating base plate (for example, made of glass) 201 there is mounted a transparent electroconductive electrode 202 (for example, made of ITO or $SnO_x$) and a carrier transport layer 203 and an organic light emitting layer 204 are laminated thereon. On the light emitting layer 204, an upper electrode 205 is mounted. Between the electroconductive electrode 202 and the upper electrode 205, there is applied a DC or AC electric field as an outer voltage. Another carrier transport layer may be provided between the organic light emitting layer 204 and the upper electrode 205. The organic light emitting layer 204 is preferably 100 Å to 5 μm in thickness.

Figure 3:
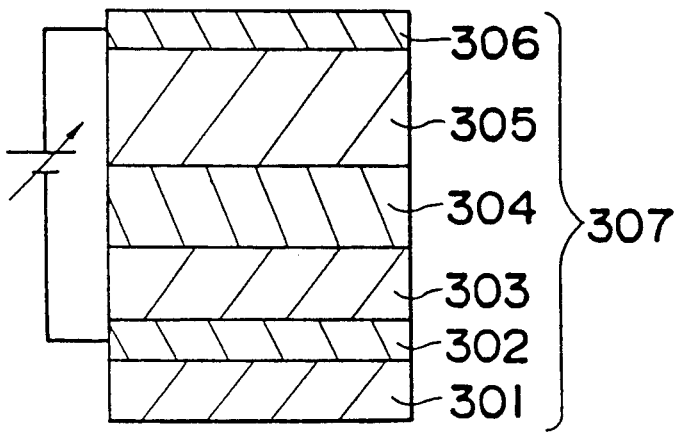

FIG. 3 is a sectional view of a third embodiment an organic light emitting device used for a spatial light modulator and a light neural network device. In the device, on an insulating base plate 301 there is mounted a lower electrode 302 and a light receiving layer 303 and an organic light emitting layer 304 are laminated thereon. On the light emitting layer 304, a carrier transport 305 and an transparent upper electrode 306 are further mounted. The lower electrode may be a transparent electroconductive electrode. Between the lower electrode 302 and the upper electrode 306, there is applied a DC or AC electric field as an outer voltage.

If a light from the light emitting layer is received by the organic light receiving layer in the case of FIG. 3, the light emitting device provides a memory ability characteristic. On the other hand, if the lower electrode 302 is a transparent electroconductive electrode and a light through the lower electrode 302 is irradiated from outside to the organic light receiving layer 303, the device provides an ability of a light emitting type spatial light modulator.

Now, the polymer containing a repeating unit of the formula (I) and (II) of the present invention will be explained in detail.

The polymer used for the present invention comprises the repeating units of the formula:

   (I)

In the formula (I), n is a number of at least 2 and X is O, S, Se or Te. Y is an aromatic or substituted aromatic group and Z is a group including an imide cycle.

The Y group examples include condensed polycyclic hydrocarbons and their substituted derivatives (e.g., anthrancene, naptharene, pyrene, perylene, naphthacene, benzoanthracene, benzophenanthrene, crycene, triphenylene, phenanthrene, etc.), condensed polycyclic quinones (e.g. anthraquinone, dibenzopyrenequinone, anthoanthrone, isoviolanthrone, pyranthrone, etc.). Among their examples, Y group of the formula (I) is preferably selected from the following group examples:

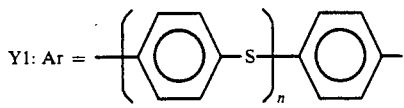

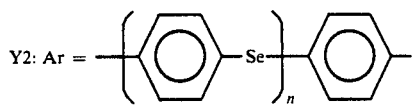

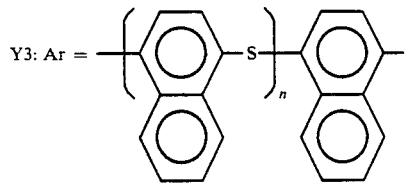

wherein n is preferably from 1 to 5.

The Z group examples include any group including an imide cycle, preferably selected from the following examples:

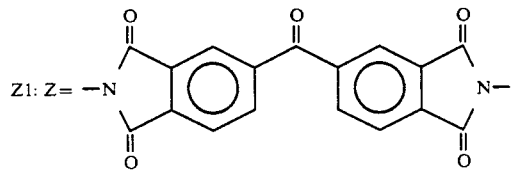

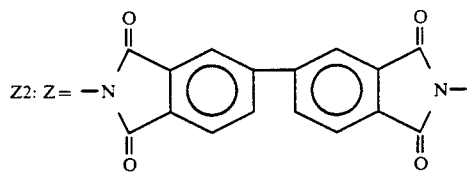

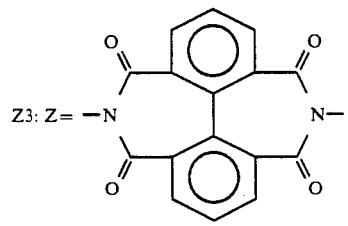

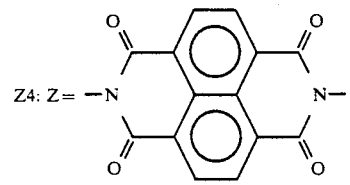

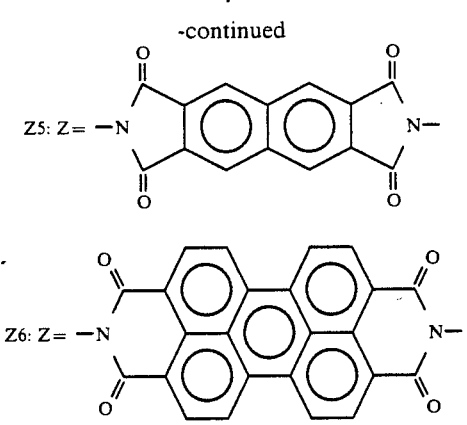

As the representative examples corresponding to three original colour, the Y group of the formula (I) includes perylene (orange), coronene (green) and anthracene (blue).

Examples of the organic polymer comprising the repeating unit of the formula (I) are polyimide, polyamide imide, polyamide, polyether amide, polyester, polyester imide, polyester amide and the like. Among their examples, the following examples are preferred.

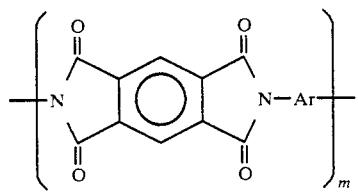

wherein m is preferably from 10 to 10,000.

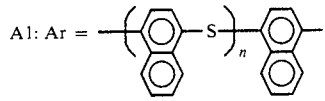

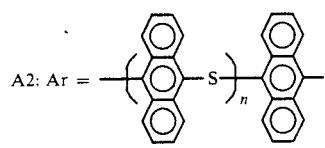

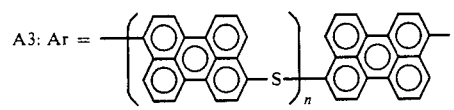

wherein n is preferably from 1 to 5.

The polymer used for the invention has a weight (or number) average molecular weight of $10^2$ to $10^5$, preferably $10^3$ to $5 \times 10^4$.

The organic molecule of the formula (I) may constitute a backbone or a side chain of the polymer.

The polymer used for a carrier transport layer and an organic light receiving layer comprises the repeating units of the formula:

$$-(X-Y)_n-\qquad (II)$$

In the formula (II), n is a number of at least 2 and X is O, S, Se or Te. Y is an aromatic or substituted aromatic group, and their examples include condensed polycyclic hydrocarbons and their substituted derivatives (e.g. benzene, anthracene, naphthalene, pyrene, perylene, naphthacene, benzoanthracene, benzophenanthrene, crycene, triphenylene, phenanthrene, etc.), condensed polycyclic quinones and their substituted derivatives (e.g. anthraquinone, dibenzopyrenequinone, anthoanthrone, isoviolanthrone, pyranthrene, etc.), metal-free phthalocyanine, metal phtharocyanines (containing a metal such as copper, lead, nickel, aluminum and the like) indigo, thioindigo and their derivatives.

Examples of the organic polymer comprising the repeating unit of the formula (II) are polyimide, polyamide imide, polyamide, polyether amide, polyester, polyester imide, polyester amide and the like. The polymer used for the invention has a weight (or number) average molecular weight of $10^2$ to $10^5$, preferably $10^3$ to $5 \times 10^4$.

Among their examples, the following examples are preferred.

The organic molecule of the formula (II) may constitute a backbone or a side chain of the organic polymer.

Among the following examples, A1 to A12 are copolymers in which the organic polymer is polyimide. In A1 to A6, an acid component of polyimide is pyromellitic acid. In the formula (II), X is S, and Y is benzene ring in A1; X is Se, and Y is benzene ring in A2; X is S, and Y is naphthalene ring in A3; X is S, and Y is anthracene ring in A4; X is S, and Y is perylene ring in A5; X is S, and Y is 2,5-dichlorobenzene ring in A6;

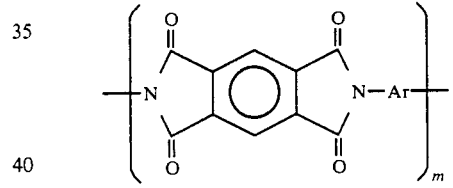

wherein m is preferably from 10 to 10,000.

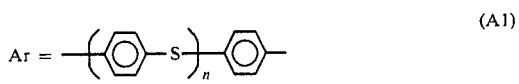

(A1)

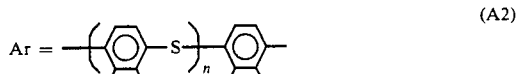

(A2)

(A3)

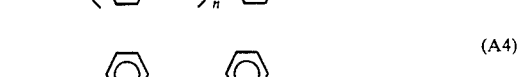

(A4)

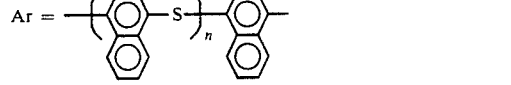

(A5)

-continued

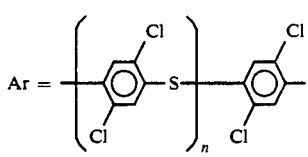
(A6)

The examples A7 to A12 are similar to A1 but n is fixed at 2, and as an acid componeent of polyimide, is used 3,3',4,4'-benzophenonetetracarboxylic dianhydride in A7; 3,3',4,4'-biphenyltetracarboxylic dianhydride in A8; 1,1',5,5'-biphenyltetracarboxylic dianhydride in A9; naphthalene-1,4,5,8-tetracarboxylic dianhydride in A10; naphthalene-2,3,6,7-tetracarboxylic dianhydride in A11; or perylene-3,4,9,10-tetracarboxylic dianhydride in A12.

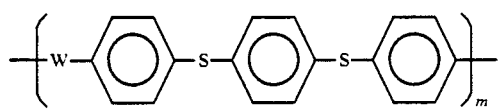

wherein m is preferably from 10 to 10,000.

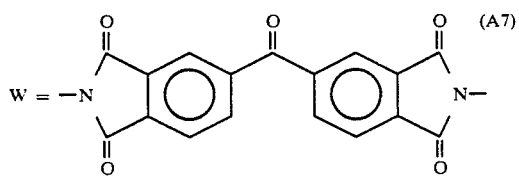
(A7)

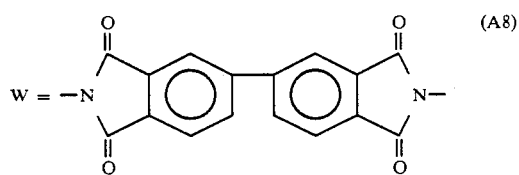
(A8)

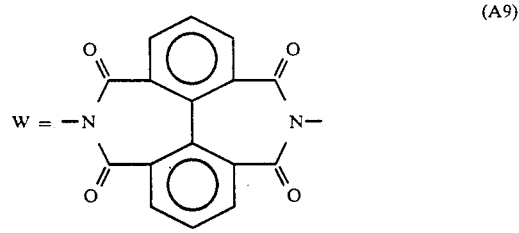
(A9)

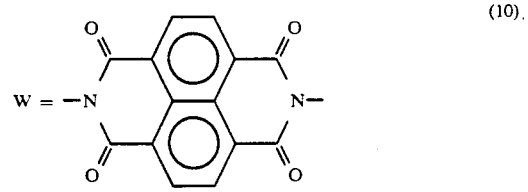
(10)

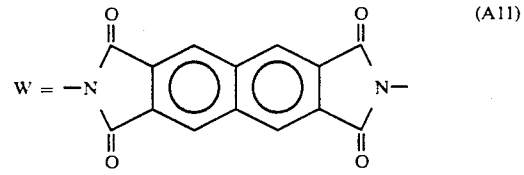
(A11)

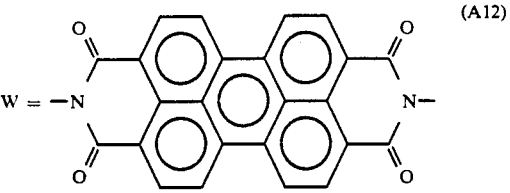
(A12)

The above polyimide may be prepared by any of conventional polymerization methods. For example, a tetracarboxylic dianhydride as an acid component and a diamine compound which is represented by the formula (I) and (II) having amine groups at both ends are reacted in an organic polar solvent (e.g. N,N'-dimethylacetamide, 1-methyl-2-pyrrolidinone, N,N'-dimethylformamide, m-cresol, etc.). Especially, a preferred available process for preparing the above polymer is disclosed in U.S. Ser. No. 673,759 (filed Mar. 25, 1991).

In a process for preparing the organic light emitting device, there may be used a coating method, a vacuum deposition method, a molecular beam epitaxy (MBE), an ionized cluster method and etc. for forming an organic light emitting layer, a carrier transport layer and a light receiving layer by using the polymer as well as a method of gas-liquid boundary developing growth. The method of gas-liquid boundary developing growth includes a LB method. Among their methods, a LB method is most preferred, because a thin and no pin hole layer can be formed on a desired surface. In the LB mothod, conventional techniques may be applied.

The present invention will be illustrated by the following examples.

EXAMPLE 1

In the organic light emitting device shown in FIG. 1, a transparent insulating base plate 101 is made of glass base plate and thereon a transparent electroconductive electrode 102 is formed as an Indium Tin Oxide (ITO) layer of 0.1 to 0.5 μm in thickness by means of spattering. As an organic light emitting device 103, a polymer A2 having a light emitting part of anthracene is laminated by a LB method as a example of a gas-liquid boundary developing growth while a spin coating method is used for forming the layer. The following description explains a process for forming a layer by the LB method.

Figure 4:
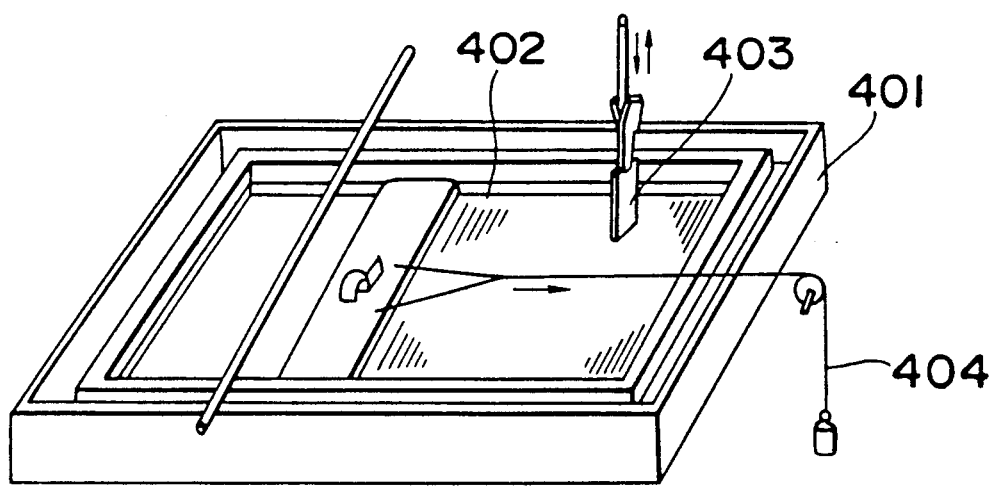
FIG. 4 is a schematic view of an accumulation apparatus for carrying a LB method to prepare the light emitting device according to the present invention.

FIG. 4 is a schematic view of an accumulation apparatus for carrying a LB method. In FIG. 4, 401 denotes a LB apparatus, 402 is a tank for developing pure water, 403 is a base plate and 404 is a weight.

Diamine compound having an anthracene group as a light emitting part and pyromellitic acid anhydride of an aromatic tetracarboxylic acid dianhydride are added in the ratio 1:1 to organic solvent of dimethyl acetamide and polymerized to obtain a polyamide acid. The polyamide acid is diluted with a mixture solvent (1:1) of dimetylacetamide and benzene to 1 mmol/l. The polyamide acid is controlled with C16DMA in the ratio 1:2 just before the mixture is developed at the boundary of gas and water.

The accumulation condition of polyamide acid monomolecular film is a surface pressure of 25 dyn/cm, a pulling up speed of 3 to 10 mm/min and a room temperature of 20. A resultant film of 100 Å in thickness is obtained by 20 times of developing.

Finally, polyamide accumulation film is imidized by a chemical imidation method. A base plate is dipped into a mixture of acetic anhydride, pyridine and benzene (1:1:3) for 12 hours to form a polyimide accumulation film thereon and washed with benzene to remove the solvent.

Figure 5:
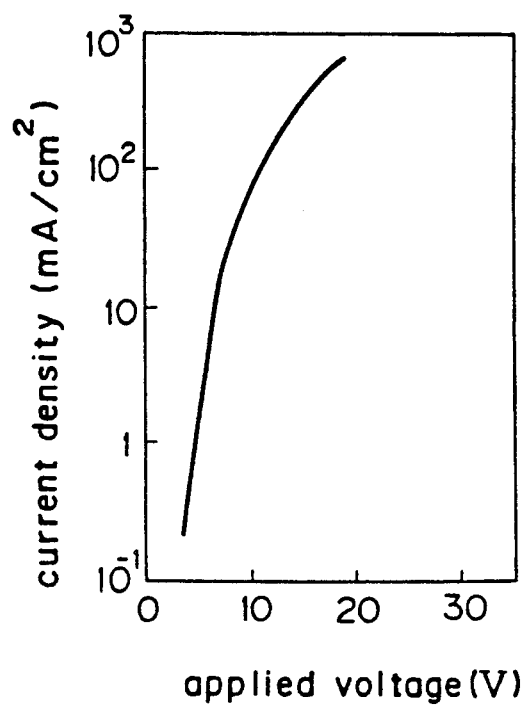
FIG. 5 shows the voltage-current characteristic of Example 1.
Figure 6:
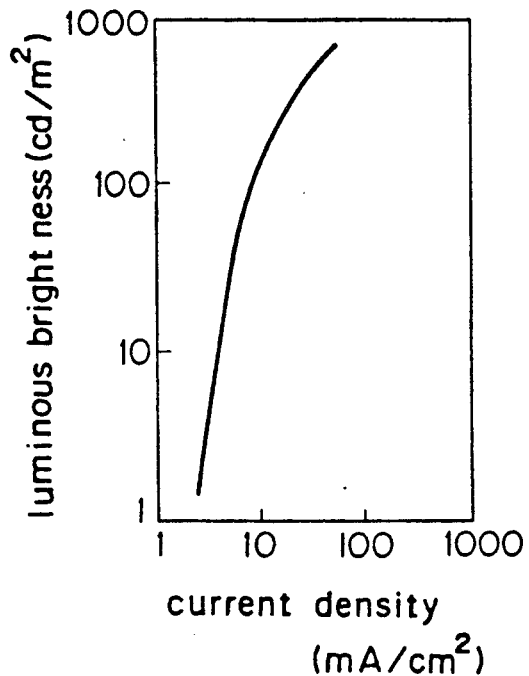
FIG. 6 shows the current-luminous brightness characteristic of Example 1.

The resultant device is tested as to the electric and light emitting properties. In the test, a DC voltage is applied between the transparent electrode 102 and the upper electrode 104. The voltage-current characteristic is shown in FIG. 5 and the current-luminous brightness characteristic in FIG. 6. At more than 5 V of the applied DC voltage, the current density becomes more than 100 mA/cm$^2$ and at the same time the brightness begins to be beyond 100 cd/m$^2$. At 10 V of the applied voltage, the luminous brightness of about 500 cd/m$^2$ is obtained.

Figure 7:
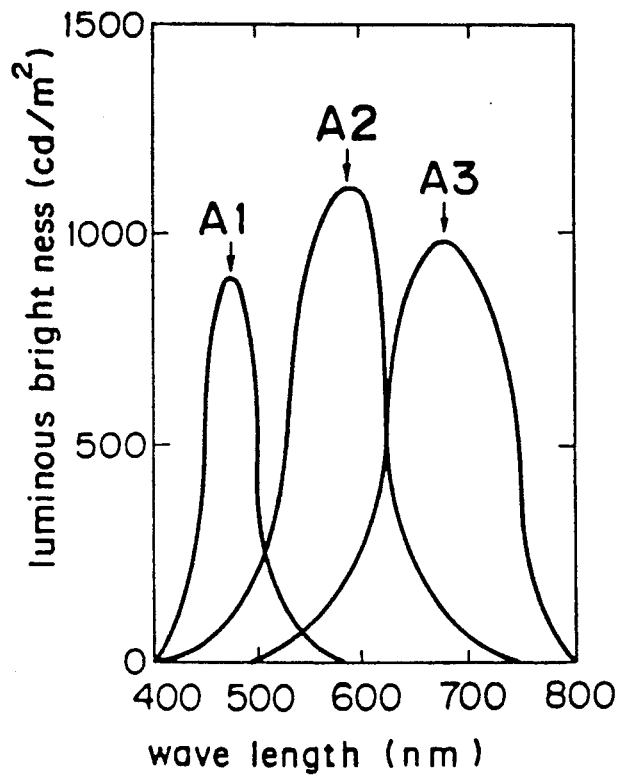
FIG. 7 shows the luminous spectrum of the organic light emitting device according to the present invention.

In the place of anthracene as a group of the light emitting part, each polymer coating having a naphtharene, pyrene and perylene group is formed. Each of emission spectrum at 10.V of applied voltage is shown in FIG. 7.

EXAMPLE 2

In the organic light emitting device shown in FIG. 2, on a transparent insulating base plate 201 made of glass base plate there is formed ITO layer of 0.1 to 0.5 μm in thickness as a transparent electroconductive electrode 202 by means of spattering and formed an carrier transport layer 203. As a material of the carrier transport layer 203, a polyimide (hereinafter referred to as BPDA-Phn wherein n is defined as below), which is polymerized from benzophenonetetracarboxylic dianhydride (hereinafter referred to as BPDA) and oligo p-phenylenesulfide diamine (hereinafter referred to as SDA-n, which is represented by the formula:N-H$_2$—A—NH$_2$ wherein A: —(Ph—S)$_{n-1}$—Ph—;n=2,3,4,5) is used. In the synthesis of a polyamic acid as a precursor of the polyimide, BPDA and SDA-n are polymerized in a soluvent of dimethylacetamide. The polyamic acid is coated by a thickness of 500 to 2000 Å on the base plate surface by means of spinner. After application, the base plate is haeted for 2 fours at 300° C. in a furnace. In this process the polyimide film is imidized and crystallized. As an organic light emitting layer, the polymer A2 is formed by a degree of 5 atomic layer by means of the same method of Example 1.

Figure 8:
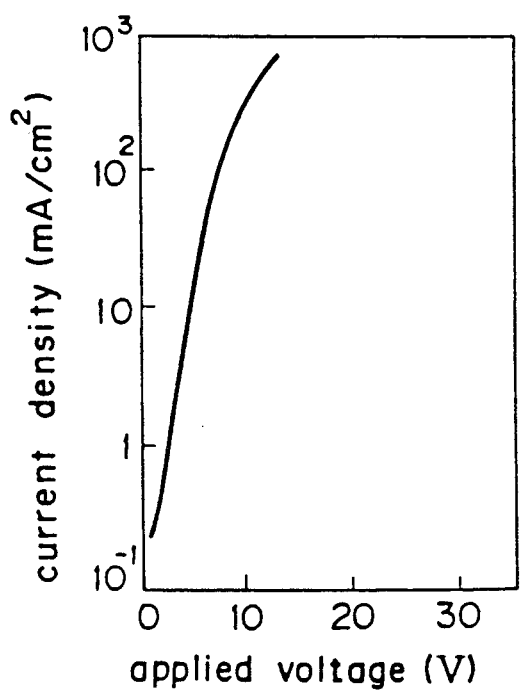
FIG. 8 shows the current-luminous brightness characteristic of Example 2.
Figure 9:
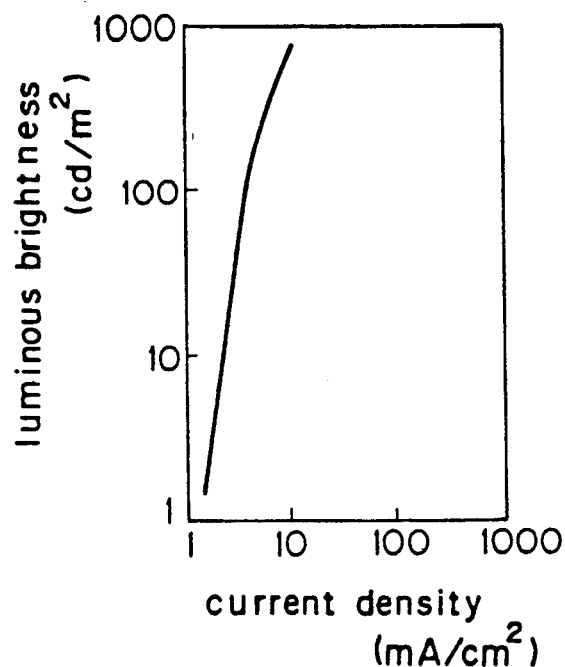
FIG. 9 shows the voltage-luminous brightness characteristic of Example 3.

The resultant device is tested as to the electric and light emitting properties. In the test, a DC voltage is applied between the transparent electrode 202 and the upper electrode 205. The voltage-current characteristic is shown in FIG. 8 and the current-luminous brightness characteristic in FIG. 9. At more than 7 V of the applied voltage, the current density becomes more than 100 mA/m$^2$ and at the same time the brightness begins to be beyond 100 cd/m$^2$. At 10 V of the applied voltage, the luminous brightness of about 500 cd/m$^2$ is obtained.

EXAMPLE 3

A light emitting device having an organic light receiving layer of polyimide with an ability of memory is prepared. A device structure is shown in FIG. 3. As a lower electrode 302, ITO is formed on a glass base plate 301 and thereon BPDA-Ph3 (BPDA-Phn wherein n=3) of 2 μm in thickness is formed as a light receiving layer 303 by means of a method of example 2. A light emitting layer 304 is formed by the polymer A2 comprising anthracene having a emission peak wavelength of 480 nm and the polymer A1 comprising naphtharene having a emission peak wavelength of 460 nm. BPDA-Ph3 has a sensitive region shorter than 550 nm. A upper transparent electrode 306 is formed with ITO at a room temperature.

Figure 10:
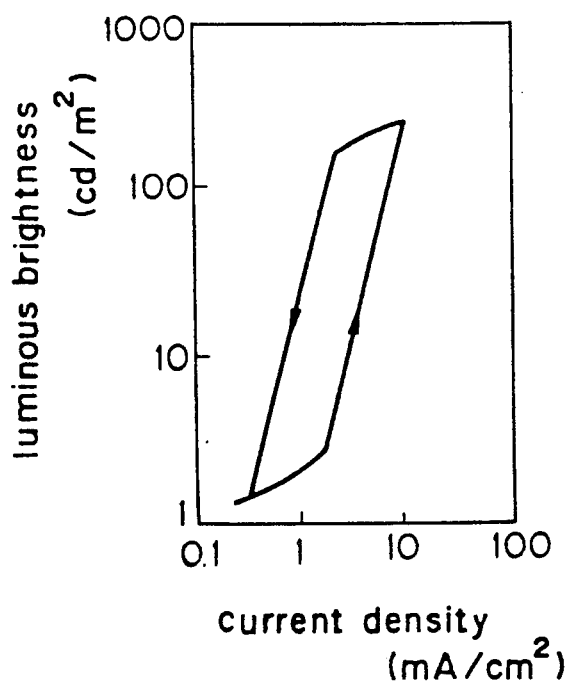
FIG. 10 shows the memory property of Example 3.

The applied voltage-luminous brightness characteristic is shown in FIG. 10. The brightness property shows hysteresis. That is, at 40 V of applied voltage it comes to be in a light emitting state and keep such a light emitting state until less than 20 V of applied voltage.

EXAMPLE 4

In a structure of the organic light emitting device of example 2, a full colour display is prepared by using 3 original colour, as picture components, comprising the polymer A2 having anthracene group as a blue light emitting part, the polymer having pyrene group as a green light emitting part and the polymer having perylene group as a red light emitting part.

This image display apparatus provides more than 1000 hours of half life at 50 fL of the luminous brightness. The energy transfer efficiency is 1.0 to 3.3%. According to the present invention, there is provided a high bright multicolour display having a long life and an ability of stable driving at a low voltage.

EXAMPLE 5

Figure 11:
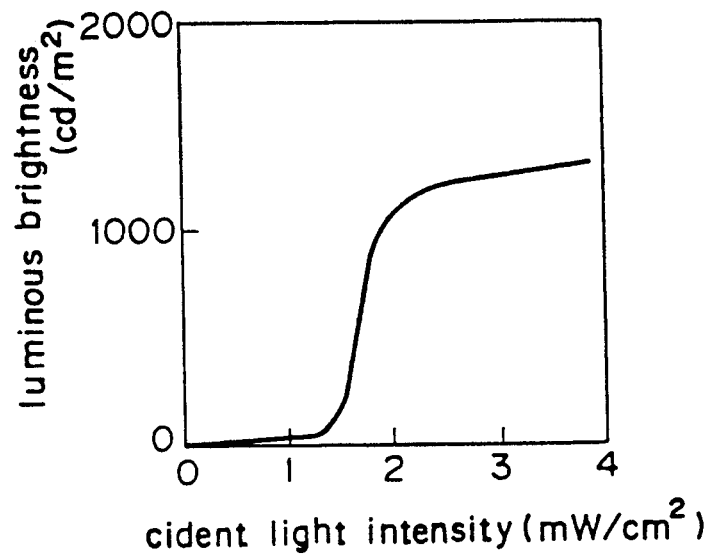
FIG. 11 shows the change of luminous brightness relating to the incident light intensity.

A spatial light modulator device of light emitting type is prepared. The device structure is same as Example 3. In this case, a light receiving layer 303 is light-written by means of incident light from a glass base plate 301. The incident light is a semiconductor laser (780 nm). As a light receiving layer sensitive to this wave length, a polyimide layer containing 2 wt. % of non-metallic phthalocyanine is formed by an almost same method as Example 3. A light emitting layer 304 is formed of the polymer having a emission peak of 480 nm by a method similar to Example 3. A change of the luminous brightness relating to an intensity of incident light is shown in FIG. 11. It shows a non-linear property and a memory property. That is, A part in a state of light emitting by means of light-writing is maintained after incident light disappears. When incident light is irradiated at 35 V of applied voltage, a voltage drop occurs in the light receiving layer and thus electric field is concentrated to the light emitting layer 304 and thereby light is emitted. Without an incident light, the light receiving layer keep a low resistance condition by means of irradiation from the light emitting layer and thus the light emitting state is maintained. When the applied voltage becomes less than 5 V, the device enter into quenching state and even if the voltage returns to the primary voltage of 35 V, the light receiving layer 203 becomes a high resistance condition and the quenching is maintained.

Figure 12:
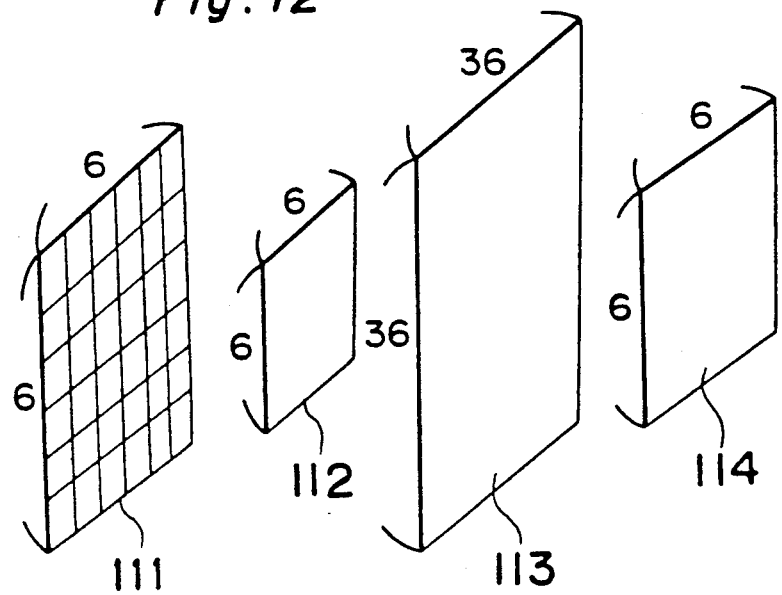
FIG. 12 is a schematic view of the optical neural network system.

An optical neural network system is constituted by using the light emitting device and a test for its function and operation is carried. The device structure is shown in FIG. 12. The system is operated on the basis of an orthogonal learning method and is constituted of an incident picture 111 comprising the light emitting device of Example 1, a microlens array 112, a learning mask pattern 113 and an optical threshold device 114. The incident picture 111 has a matrix of 6×6 and can indicate 10 words of alphabet. As a picture input, a memory ability is used and each picture element is electrically written. The learning mask pattern 113 comprises a matrix of 36×36 and i a variety of transmissivity in order to indicate 8 gradients depending on the intensity of transmitted light. The optical threshold device 114 comprises a matrix of 6×6, in which a transmitted light is condensed from 6×6 of mask patterns to each picture element through the microlens array 113. The light emitting is made according to a light non-linear manner shown in FIG. 9. The system make answers with a recognition rate of 100% to a self-imagination of perfect pattern provided alphabet 10 words and an association of imperfect pattern provided with a hamming distance of 1.

As explained above, according to the embodiment of the present invention, a picture indication device comprising a light emitting device having a light emitting layer containing a polymer of the formula (I) make it possible to realize a high bright display provided with a long life and stable driving at a low voltage and also realize a spatial light modulator having an ability of light-writing by means of light irradiation from outside. Therefore, the device is preferred to an optical computing system including an optical neural network system as a representative device or system.

EXAMPLE 6

In the organic light emitting device shown in FIG. 2, polyimide (BPDA-Phn) as a polymer including a repeating unit of the formula (II), which is polymerized by BPDA and SDA-n, is used as the material of a carrier transport layer 103. A polyamic acid as a precursor of the polyimide is synthesized by BPDA and SDA-n in a solvent of dimethylacetamide (DMAc). The polyamic acid is applied to the surface of the above glass base plate with a thickness of 500 to 2000 Å by spinner. The glass base plate is heated for 2 hours at 300° C. in a furnace after the application. The polyimide film is imidized and crystallized in this process. As an organic light emitting layer, 8-quinolinol aluminum complex ($Alq_3$) is formed from 200 to 500 Å by a vacuum depositing. The upper electrode 205 is formed with MgIn by the same vacuum depositing.

Figure 13:
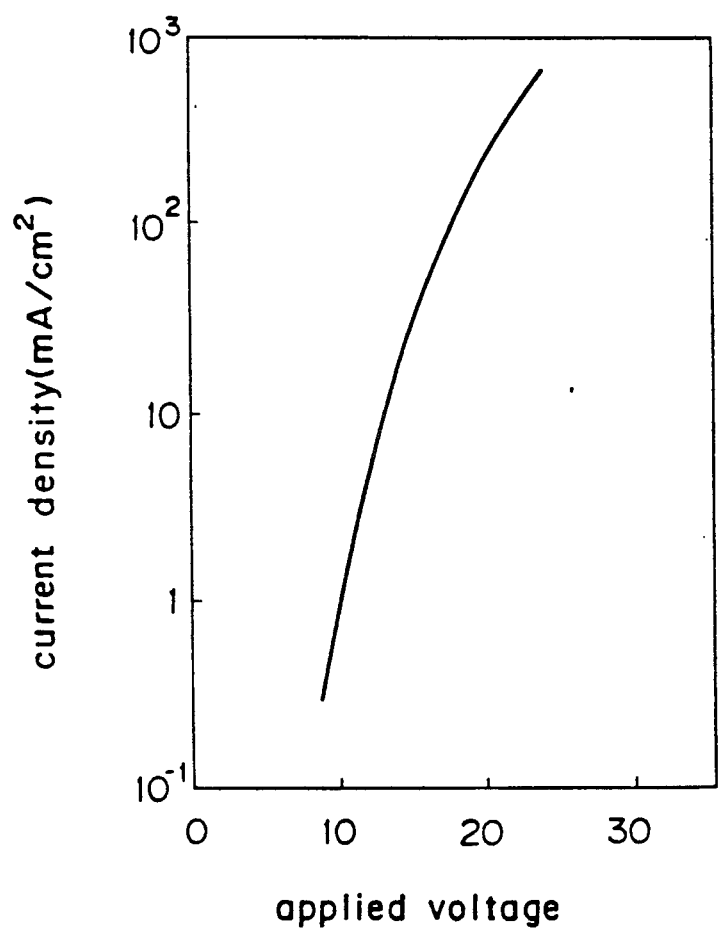
FIG. 13 shows the voltage-current characteristic of Example 6.
Figure 14:
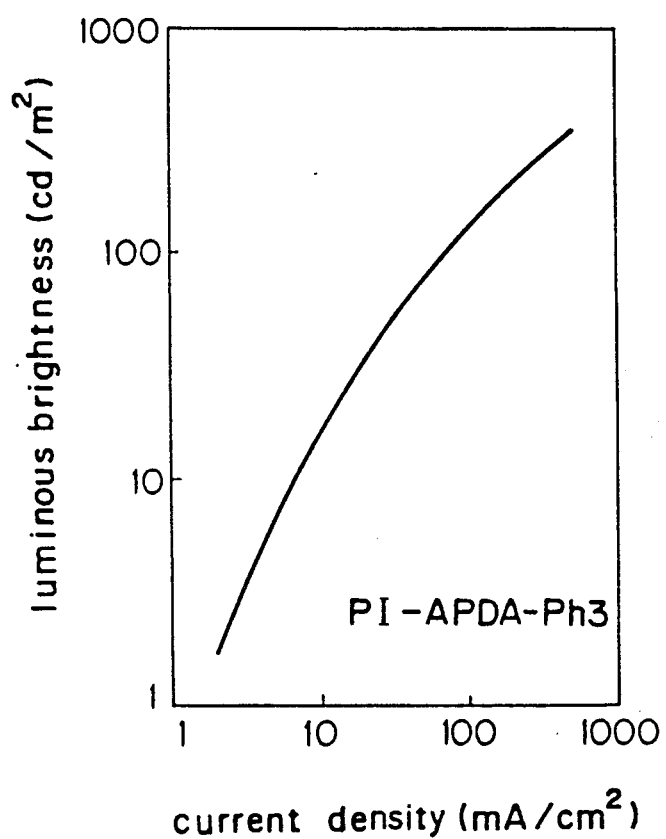
FIG. 14 shows the current-luminous brightness characteristic of Example 6.

The resulting device is tested as to the electric and light emitting properties. In the test, a DC voltage is applied between the transparent electrode 202 and the upper electrode 205. The voltage-current characteristic is shown in FIG. 13 and the current-luminous brightness characteristic in FIG. 14. At more than 20 V of the applied DC voltage, the current density becomes more than 100 $mA/m^2$ and at the same time the brightness begins to be beyond 100 $cd/m^2$. At 25 V of the applied voltage, the luminous brightness of about 500 $cd/m^2$ is obtained.

EXAMPLE 7

Figure 15:
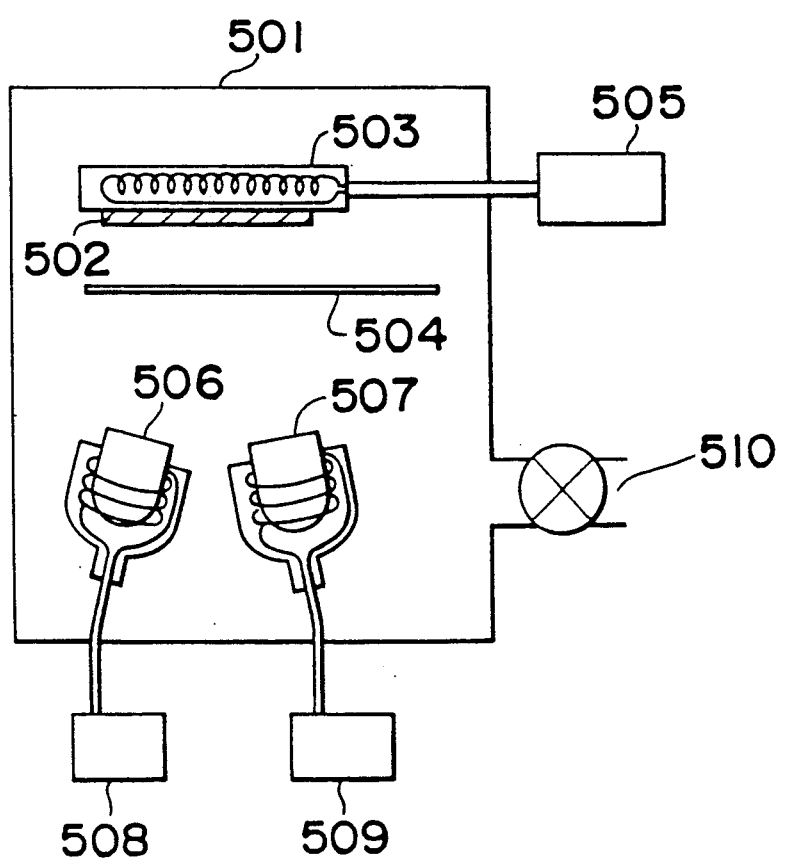
FIG. 15 is a schematic view of the vacuum depositing apparatus for preparing the organic light emitting device according to the present invention.

In Example 6, a carrier transport layer is formed by a vacuum depositing. The depositing process is carried by an apparatus having two depositing source crucible as shown in FIG. 15. The carrier transport layer is formed with a polyimide (BPDA-Phn) by depositing BPDA and SDA-n. BPDA is put in the first crucible and the following diamine compound (SDA-n) is put in the second crucible. The following 4 kinds of the polyimide layer is formed and tested.

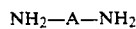

$NH_2$—A—$NH_2$

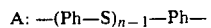

A: —$(Ph—S)_{n-1}$—Ph— n=2,3,4,5.

A base plate 201 provided with a transparent electroconductive electrode 202 is set at a base plate temperature of 50° C. and placed in a vaccum apparatus. Each crucible temperature is controlled to adjust each depositing rate to be equal. After forming the layer, a polyamic acid polymer as a precursor of the polyimide is heated to more than 250° C. and subjected to imidation and crystallization treatment.

An organic light emitting layer 204 is laminated with $Alq_3$ in a same vaccum depositing as Example 6.

Figure 16:
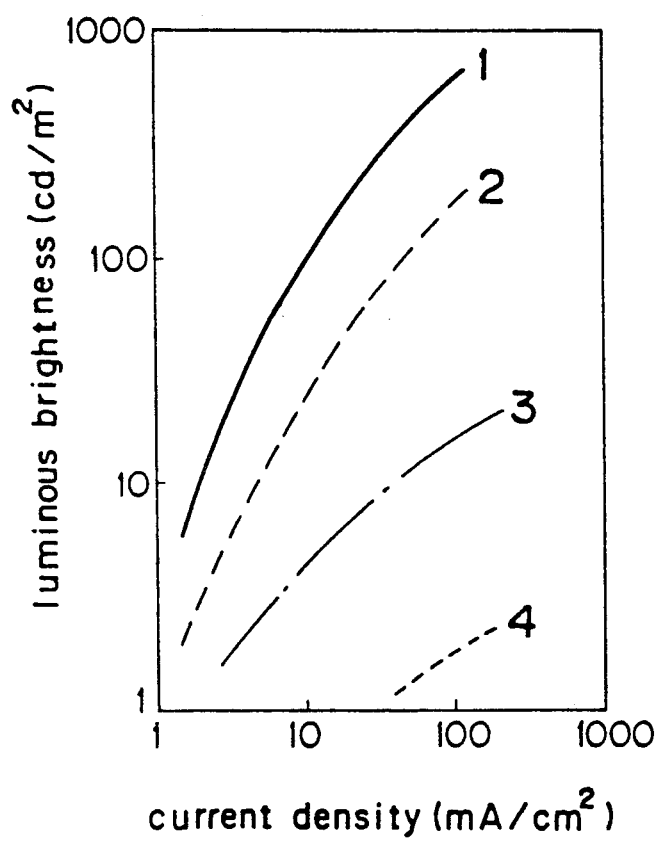
FIG. 16 shows the current-luminous brightness characteristic of Example 7.

FIG. 16 shows a current-luminous brightness characteristic as to the resultant 4 kinds of organic light emitting devices. The reason that the polyimide of the above formula wherein n is odd has a superior property is caused by the crystallinity. In the case of BPDA-Ph3 indicating a best property, even a film formed by a polymer coating method can improve the property. That is, at a current density of 10 $mA/cm^2$, there is obtained a light emitting brightness of 100 $cd/m^2$, which indicates a luminous efficiency having an order of magnitude larger.

EXAMPLE 8

A organic light emitting device having an organic light receiving layer is prepared to have a memory property. FIG. 3 shows the device structure. In the structure, as a lower electrode 302, ITO is formed on a glass base plate and then BPDA-Ph3 is laminated by 2 μm thereon as a light receiving layer 303. A light emitting layer is made of 1,1,4,4-tetraphenyl-1,3-butadiene having a luminous peak wavelength of 430 nm. The sensitive region of BPDA-Ph3 is less than 550 nm. Therefore, it does not meet to the luminous peak of $Alq_3$ (550 nm). As a melting point of a carrier transport layer 305 is less than 100° C., it is made of a depositing film (500 Å) of triphenylamine derivative (N,N'-diphenyl-N,N'-(3-methylphenyl)-1,1'-biphenyl-4,4'-diamine:- TAD) in the place of BPDA-Ph3. A transparent electrode 306 is formed at a room temperature by ITO.

Figure 17:
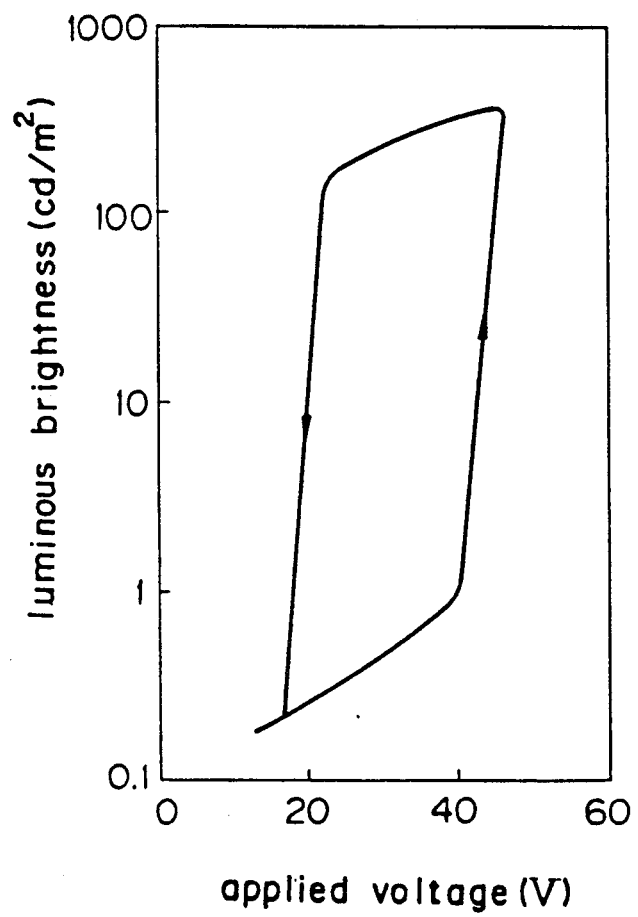
FIG. 17 shows the voltage-luminous brightness characteristic of Example 8.

FIG. 17 shows an applied voltage -luminous brightness characteristic. The brightness property shows hysteresis. That is, at 40 V of applied voltage it comes to be in a light emitting condition and keep such a light emitting condition until less than 20 V of applied voltage.

Figure 18:
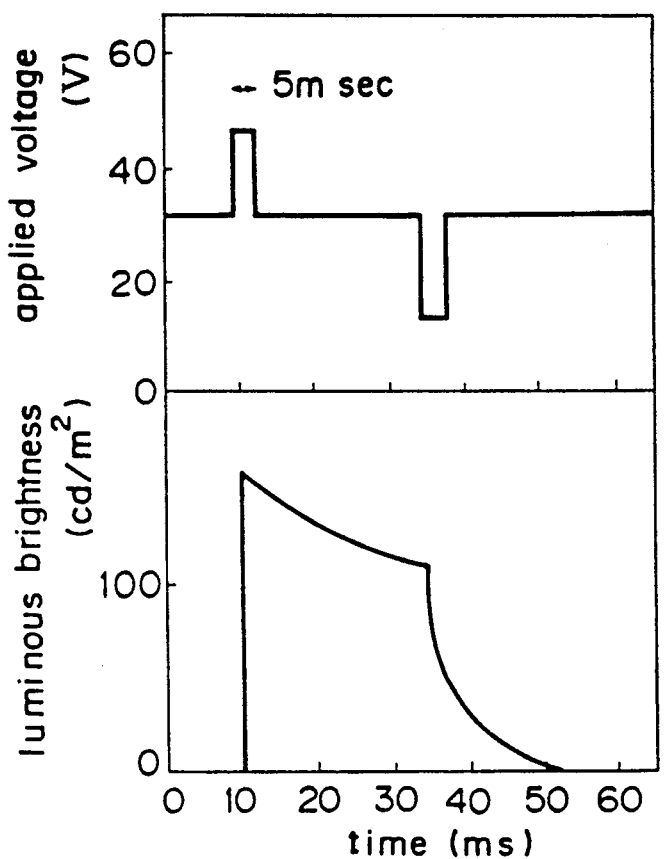
FIG. 18 shows the memory property of Example 8.

FIG. 18 shows a luminous property to a pulse applied voltage. When 45 V comprising +15 V of pulse height and 30 V of bias voltage is applied, a luminous brightness of 150 $cd/m^2$ is obtained. After a pulse voltage is lost, light emitting is maintained. On the other hand, when pulse height is −15 V, the applied voltage is 15 V and quenching begins. Thereby, until a pulse is applied, a condition can be maintained and it means to realize the light emitting device having a memory ability.

EXAMPLE 9

Figure 19:
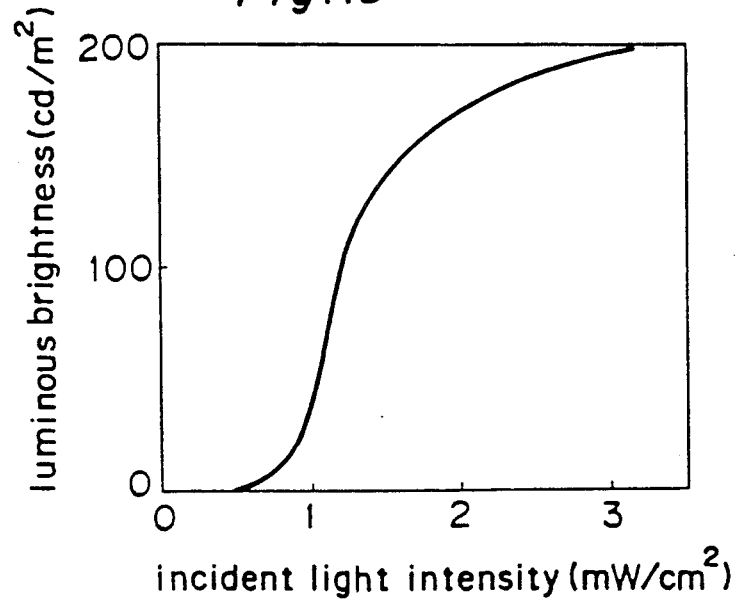
FIG. 19 shows the change of luminous brightness relating to the incident light intensity in Example 9.
Figure 20:
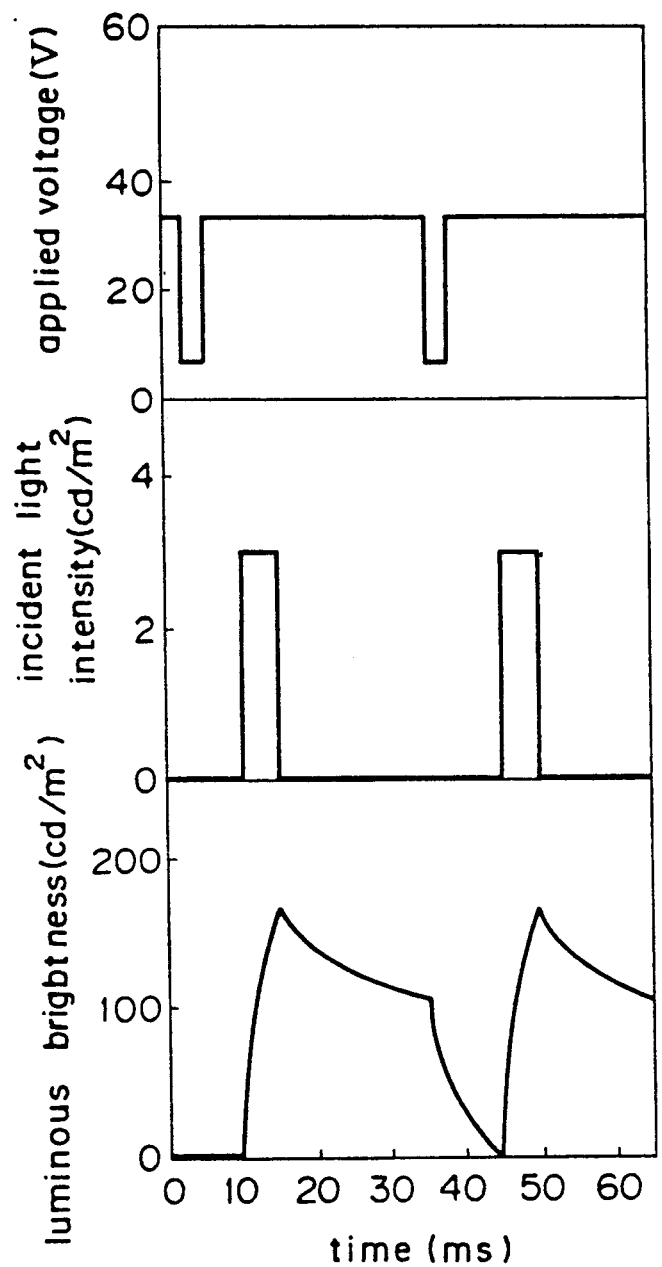
FIG. 20 shows the memory property to the incident light of the organic light emitting device in Example 9.

A light emitting type spatial modulator device is prepared. The device structure is same as Example 8. In this case, a light receiving layer 303 is written by an incident light from a glass base plate 301. Therefore, an output light from a light emitting layer 304 is not needed to be absorbed, the layer is made of $Alq_3$. As the incident light, argon ion laser (488 nm) is used. A change of luminous brightness to an intensity of incident light is shown in FIG. 19. It shows non-linear property. Therefore, it is available to an optical threshold device. In this case, as the device has not a memory property, light emitts only by incident light. On the other hand, if a light emitting layer 304 is made of the same as Example 3. That is, at the part which is written by a light to be in a light emitting state, the light emitting state is maintained after any incident light is lost. FIG. 20 shows the change thereof. When incident light is irradiated at 35 V of the applied voltage, the voltage of the light receiving layer drops and thus an electric field concentrates into the light emitting layer 304 and the carrier transparent layer 305, thereby the device comes to be in a light emitting state. Without incident light, the receiving layer keeps a low resistant condition by means of irradiation from the light emitting layer and thus a light emitting state is maintained. On the other hand, when the applied voltage becomes less than 5 V, quenching begins and such a state is maintained even if the applied voltage returns to the primary voltage of 35 V, because the light receiving layer comes to be in a high resistance.

EXAMPLE 10

An optical neural network system of FIG. 12 is constituted by using the light emitting device of Example 9 and a test for its function and operation is carried. The device structure is shown in FIG. 11. The system is operated on the basis of an orthogonal learning method and is constituted of an incident picture 111 comprising the light emitting device of Example 8, a microlens array 112, learning mask pattern 113 and an optical threshold device 114 of Example 9. The input picture 111 has a matrix of 7×8 and can indicate 26 words of alphabet. As a picture input, a memory ability is used and each picture element is electrically written. The learning mask pattern 113 comprises a matrix of 49×64 and is made of a film having a variety of transmissivity in order to indicate 8 gradients depending on the intensity of transmitted light. The light threshold device 114 comprises a matrix of 7×8, in which a transmitted light is condensed from 7×8 of mask patterns to each picture element through the microlens array 113. The light emitting is made according to a light non-linear property shown in FIG. 19. The system make answers with a recognition rate of 100% to an association of pattern provided alphabet 26 words.

As explained above, according to the embodiment of the present invention, a picture indication device comprising a light emitting device having a carrier transport layer and a light receiving layer containing a polymer comprising a repeating unit of the formula (II) make it possible to realize a high bright display provided with a long life and stable driving at a low voltage and also realize a spatial light modulator having an ability of light-writing by means of light irradiation from outside. Therefore, the device is preferred to an optical computing system including an optical neural network system as a representative device or system.

What is claimed is:

1. An organic light-emitting device having a light-emitting layer between a pair of electrodes mounted on a base plate, in which the light-emitting layer contains a polymer comprising a repeating unit of the formula:

$$-Z-(X-Y)_n- \quad (I)$$

wherein n is at least 2; X is O, S, Se or Te; Y is an aromatic or substituted aromatic group; Z is a group containing an imide ring.

2. An organic light-emitting device having a carrier transport layer and a light-emitting layer between an upper electrode and a lower electrode mounted on a base plate, wherein the light-emitting layer contains a polymer comprising a repeating unit of the formula:

$$-Z-(X-Y)_n- \quad (I)$$

wherein n is at least 2; X is O, S, Se or Te; Y is an aromatic or substituted aromatic group; Z is a group containing an imide ring.

3. The organic light-emitting device according to claim 2, wherein the carrier transport layer is a layer of a polymer comprising a repeating unit of the following formula:

$$-(X-Y)_n- \quad (II)$$

wherein n is at least 2; X is O, S, Se or Te; Y is an aromatic or substituted aromatic group.

4. A light-emitting device used for a light spatial modulator or a light neural network system, comprising a lower electrode on a base plate, a light-emitting layer, a carrier transport layer and a transparent electrode which are laminated in turn on the lower electrode, in which the light-emitting layer contains a polymer comprising a repeating unit of the formula:

$$-Z-(X-Y)_n- \quad (I)$$

wherein n is at least 2; X is O, S, Se or Te; Y is an aromatic or substituted aromatic group; Z is a group containing an imide ring.

5. The organic light-emitting device according to claim 4, wherein the carrier transport layer or the light receiving layer or both the carrier transport layer and light receiving layer are a layer of a polymer comprising a repeating unit of the following formula:

$$-(X-Y)_n- \quad (II)$$

wherein n is at least 2; X is O, S, Se or Te; Y is an aromatic or substituted aromatic group.

6. An organic light-emitting device having a carrier transport layer and a light-emitting layer between an upper electrode and a lower electrode mounted on a base plate, wherein the carrier transport layer is a layer of a polymer comprising a repeating unit of the following formula:

$$-(X-Y)_n- \quad (II)$$

wherein n is at least 2; X is O, S, Se or Te; Y is an aromatic or substituted aromatic group.

7. A light-emitting device used for a light spatial modulator or a light neural network system comprising a lower electrode on a base plate, a light-emitting layer, a carrier transport layer and a transparent electrode which are laminated in turn on the lower electrode, in which the carrier transport layer and/or the light receiving layer are a layer of a polymer comprising a repeating unit of the following formula:

$$-(X-Y)_n- \quad (II)$$

wherein n is at least 2; X is O, S, Se or Te; Y is an aromatic or substituted aromatic group.

* * * * *